United States Patent

Ito et al.

[11] Patent Number: 5,146,112
[45] Date of Patent: Sep. 8, 1992

[54] SEMICONDUCTOR INTEGRATED CIRCUIT WITH ANALOGUE SIGNAL PROCESSING CIRCUIT AND DIGITAL SIGNAL PROCESSING CIRCUIT FORMED ON SINGLE SEMICONDUCTOR SUBSTRATE

[75] Inventors: Masao Ito; Shiro Hosotani, both of Hyogo, Japan

[73] Assignee: Mitsubishi Denki Kabushiki Kaisha, Tokyo, Japan

[21] Appl. No.: 708,019

[22] Filed: May 31, 1991

[30] Foreign Application Priority Data

Jun. 4, 1990 [JP] Japan .................. 2-146972
Nov. 19, 1990 [JP] Japan .................. 2-314543

[51] Int. Cl.⁵ .......................... H03K 3/013
[52] U.S. Cl. .................... 307/303; 307/443; 357/23.7; 357/45; 364/600
[58] Field of Search ............ 357/23.7, 45; 364/600; 307/303, 443

[56] References Cited

U.S. PATENT DOCUMENTS 4,508,981 4/1985 Donler et al. .............. 307/303
4,797,583 1/1989 Ueno et al. ................ 307/446
4,872,010 10/1989 Larson et al. .............. 357/23.7
4,968,904 11/1990 Yamashita et al. .......... 307/475

OTHER PUBLICATIONS

K. Okada et al., "A Multiplying Encoder for Digital Signal Processing", Mitsubishi Electric Corporation, pp. 101-102.

Y. Okada et al., "A Mixed Analog/Digital Video Signal Processing LSI With On-Chip AD and DA Converters", IEEE 1989 Custom Integrated Circuits Conference, pp. 24.1.1-24.1.4.

N. Weste, *Principles of CMOS VLSI Design A Systems Perspective*, pp. 196-199, 201 and 299-230.

Primary Examiner—Stanley D. Miller
Assistant Examiner—Scott A. Ouellette
Attorney, Agent, or Firm—Lowe, Price, LeBlanc & Becker

[57] ABSTRACT

A semiconductor integrated circuit device having an analogue signal processing circuit and a digital signal processing circuit formed on a single semiconductor substrate is disclosed. As an example of the analogue signal processing circuit, a voltage comparator is described. Being liable to be affected by noise, an inverter 2 is formed of an NMOS transistor 41 and a resistance R. For transistor 41 is formed in a well region having a conductivity type (p) opposite to the conductivity type of the substrate (n), it is not easily influenced by noise transmitted through the substrate. Therefore, a voltage comparator independent of the adverse effect of noise from the digital signal processing circuit is obtained.

11 Claims, 10 Drawing Sheets

61: ANALOGUE CIRCUIT

CMOS DIGITAL CIRCUIT 66

SEMICONDUCTOR INTEGRATED CIRCUIT WITH ANALOGUE SIGNAL PROCESSING CIRCUIT AND DIGITAL SIGNAL PROCESSING CIRCUIT FORMED ON SINGLE SEMICONDUCTOR SUBSTRATE

BACKGROUND OF THE INVENTION

1. Field of the Invention

The invention relates generally to semiconductor integrated circuit devices, and particularly, to a semiconductor integrated circuit device provided with an analogue signal processing circuit and a digital signal processing circuit on a single semiconductor substrate. The invention has particular applicability to voltage comparators.

2. Description of the Background Art

A large scale integrated circuit device comprises an analogue signal processing circuit (referred to as "analogue circuit" hereinafter and a digital signal processing circuit (referred to as "digital circuit" hereinafter), each formed on a single semiconductor substrate. For example, in an LSI with an A/D convertor, an analogue circuit which forms a comparator and a digital circuit which forms an encoder are provided.

Generally, a digital circuit is not easily influenced by noise, since it deals with a signal having binary values for signal processing. On the other hand, in an analogue circuit, the result of processing is frequently affected by noise, since it deals with a continuously changing analogue signal. Especially, noise generated from a digital circuit provided in a single semiconductor substrate is transmitted through the substrate to the analogue circuit, thereby often causing an adverse effect on processing in the analogue circuit.

FIG. 8 is a conceptional diagram of a conventional LSI. With reference to FIG. 8, the LSI1' comprises a CMOS analogue circuit 65 including CMOS transistors and a CMOS digital circuit 66 including CMOS transistors. Analogue circuit 65 receives an externally applied input voltage signal Vi, processes the signal and then applies a digital signal indicative of the result of processing to circuit 66. In digital circuit 66, digital signal processing is performed and a digital output signal Vo is output. As shown in FIG. 8, it is pointed out that in the conventional LSI1', analogue circuit 65 and digital circuit 66 are both formed of CMOS transistors.

As an example of CMOS analogue circuit 65 shown in FIG. 8, a voltage comparator is shown in FIG. 9. With reference to FIG. 9, the voltage comparator comprises input terminals 11 and 12 for receiving voltage signals V1 and V2, respectively, transmission gates SW1 and SW2 each connected to terminals 11 and 12, a capacitor Cc having one electrode connected to the outputs of transmission gates SW1 and SW2, an inverter 7 for receiving an output signal from capacitor Cc, a transmission gate SW3 connected between the input and the output of inverter 7, and an invertor 3 connected to the output of inverter 7. Inverter 3 outputs an output voltage signal V5 through an output terminal 15.

Each of transmission gates SW1, SW2 and SW3 is formed of PMOS transistors 22, 24, 26 and NMOS transistors 21, 23, 25, respectively. Transmission gates SW1 and SW3 are responsive to clock signals $\phi$ and $\bar{\phi}$ generated from a clock generator (not shown) to be turned on during a first period, while transmission gate SW2 is turned off during the first period. Conversely, transmission gate SW1 and SW3 are responsive to clock signals $\phi$ and $\bar{\phi}$ be turned off during a second period following the first period, while transmission gate SW2 is turned on during a second period. The backgate terminals of PMOS transistors 22, 24, 26, which constitute transmission gates SW1, SW2 and SW3, respectively are connected to a power supply $V_{DD}$, and the backgate terminals of NMOS transistors 21, 23, 25 are grounded.

Inverter 7 comprises a PMOS transistor 47 and an NMOS transistor 41 connected in series between power supply $V_{DD}$ and ground. Transistors 41 and 47 are connected together with the other electrode of capacitor Cc at a node 14. Transistor 41 has its backgate terminal $B_N$ connected to ground, while transistor 47 has its backgate terminal $B_P$ connected to power supply $V_{DD}$. Inverter 3 also comprises a PMOS transistor 16 and an NMOS transistor 17 connected in series between power supply $V_{DD}$ and ground.

Now, the voltage comparator shown in FIG. 9 will be described. During the first period, transmission gates SW1 and SW3 are turned on, while transmission gate SW2 is turned off. Therefore, an input voltage V1 is applied to one electrode (node 13) of capacitor Cc through transmission gate SW1. In addition, short circuit takes place between the input and the output of inverter 7 through transmission gate SW3, and the other electrode of capacitor Cc (node 14) is therefore brought to a prescribed intermediate potential V0.

The input-output characteristic of inverter 7 is shown in FIG. 10. That is, as represented by a curve IN in FIG. 10, inverter 7 is responsive to an input voltage V13 to output an output voltage V14. When inverter 7 is short-circuited between its input and output, the input voltage V13 and the output voltage V14 come on a straight line defined by equation V13=V14. Therefore, the intersection M between the straight line OL and the curve IN defines the intermediate potential V0. As a result, capacitor Cc stores a charge Q1 in accordance with the following equation.

$$Q1 = Cc\ (V1 - V0) \quad (1)$$

During the second period following the first period, transmission gates SW1 and SW3 are turned off, and transmission gate SW2 is turned on. Accordingly, an input voltage V2 is applied to one electrode of capacitor Cc (node 13) through transmission gate SW2. Assuming that the input voltage V13 of invertor 7 is changed into a voltage $V_A$ because of this, capacitor Cc should have stored a charge Q2 in accordance with the following equation.

$$Q2 = Cc\ (V2 - V_A) \quad (2)$$

Since the charge Q1 equals the charge Q2, the following equation is obtained from equations (1) and (2).

$$V_A - V0 = V2 - V1 \quad (3)$$

Equation (3) indicates that the input voltage V13 of inverter 7 changes from the potential V0 to the potential $V_A$, depending upon a change in voltage, i.e. V2-V1 applied to one electrode of capacitor Cc (node 13). The difference of the potentials $V_A$-V0 is amplified in accordance with the characteristic curve IN indicated in FIG. 10, thereby outputting a voltage V14 representative of the result of comparison between input voltages V1 and V2.

The output voltage V14 is applied to inverter 3 shown in FIG. 9 and reversed, and then inverter 3 outputs an amplified output voltage V5. Therefore, this voltage comparator outputs, as an output voltage V5, a digital signal ("1" or "0") determined by the voltage values of the input voltage V1 and V2.

FIG. 11 is a sectional structural view of transistors 41, 47 and 53 which form CMOS analogue circuit 65 and CMOS digital circuit 66 shown in FIG. 8. As examples of transistors which form CMOS analogue circuit 65, NMOS transistor 41 and PMOS transistor 47 which form inverter 7 are shown. As an example of a transistor which form CMOS digital circuit 66, PMOS transistor 53 is shown. Assume that transistors 41, 47 and 53 shown in FIG. 11 are formed on an n-type semiconductor substrate 40. NMOS transistor 41 comprises: a p+ well region 42 formed in substrate 40; an n+ drain diffusion layer 43, an n+ source diffusion layer 44 and a P++ diffusion layer 45 each formed in well region 42; and a gate electrode 46 formed on the main surface of substrate 40 with an insulating film therebetween. Diffusion layer 45 is provided as a well contact of transistor 41.

PMOS transistor 47 comprises an n+ well region 48 formed in substrate 40, a p+ drain diffusion layer 49, a p+ source diffusion layer 50 and an n++ diffusion layer 51 each formed in well region 48; and a gate electrode 52. Diffusion layer 51 is provided as the well contact of transistor 47. Likewise, PMOS transistor 53 comprises an n+ well region 54 formed in substrate 40, a p+ drain diffusion layer 55, a p+ source diffusion layer 56 and a n++ diffusion layer 57 each formed in well region 54, and a gate electrode 58.

In a conventional LSI with an analogue circuit and a digital circuit provided on a single semiconductor substrate, it is pointed out that noise generated in the digital circuit is transmitted through the substrate to the analogue circuit, thereby causing erroneous operation by the analogue circuit. The change of voltage applied to drain diffusion layer 55 in transistor 53 shown in FIG. 11 is transmitted to substrate 40 through the junction capacitance between well region 54 and drain diffusion layer 55. The potential change transmitted to substrate 40 is delivered as noise to transistors 41 and 47 through substrate 40. Since NMOS transistor 41 is formed in p+ well region 42, it is not easily influenced by the noise. In contrast, as PMOS transistor 47 is formed in n+ well region 48 having the same conductivity type as that of substrate 40, i.e. the region with only the impurity concentration increased, the noise is transmitted into well region 48. Furthermore, the transmitted noise is also delivered to diffusion layer (well contact) 51, thereby causing the potential of well region 48 to drop. Therefore, the threshold voltage of transistor 47 is changed influenced by this noise, resulting in a change in the input-output characteristic of inverter 7 as shown by a broken line U in FIG. 13.

With reference to FIG. 12, more detailed description will be given in this connection. FIG. 12 shows the structure of PMOS transistor 47 of FIG. 11 in section more in detail. Noise $N_s$ is transmitted into n+ well region 48 through substrate 40. Of the transmitted noise $N_s$, a part of the noise N1 is transmitted to well contact 51 through well region 48. Therefore, the resistance component Rw of well region 48 causes a potential drop in well region 48. As a result, due to a backgate effect, the absolute value of the threshold voltage of transistor 47 increases, thereby changing the transistor characteristic.

In addition, of the transmitted noise $N_s$, the other part of the noise N2 is transmitted to drain diffusion layer 49 through the coupling capacitor formed between well region 48 and drain diffusion layer 49. Accordingly, the potential of drain diffusion layer 49 changes. Since drain diffusion layer 49 of transistor 47 constitutes the output of inverter 7, the potential change of drain diffusion layer 49 appears as the change in the output voltage of inverter 7. Accordingly, the input-output characteristic of inverter 7 changes in accordance with the curve U shown by a broken line in FIG. 13. Consequently, although an output voltage V14 should be obtained, which satisfies the relation in accordance with the following inequality (4), an output voltage V14 (value $V_c$) to satisfy the relation in accordance with the following inequality (5) is output instead.

$$V14 (=V_B) > V0 \qquad (4)$$

$$V14 (=V_c) < V0 \qquad (5)$$

Therefore, influenced by the noise transmitted to PMOS transistor 47 which forms inverter 7 indicated in FIG. 9, inverter 7 will output the output voltage V14 representative of an erroneous result of comparison. That is, this voltage comparator will output an output signal V5 representative of an erroneous result of comparison between input voltages V1 and V2.

In the foregoing, the case was described in which the noise $N_s$ generated from CMOS digital circuit 66 adversely affects PMOS transistor 47. Now, generation of the noise $N_s$ in CMOS digital circuit 66 will be described below. FIG. 14 is a circuit diagram of a buffer circuit forming a part of CMOS digital circuit 66. The buffer circuit includes two cascaded CMOS inverters 31' and 32'. Each of inverters 31' and 32' is formed of a PMOS transistor and an NMOS transistor. Inverter 32', for example, includes a PMOS transistor 470 and an NMOS transistor 530 connected in series between the power supply $V_{DD}$ and ground. Each of inverters 31' and 32' has the same circuit configuration as that of inverter 7 and have the same input-output characteristic as the one shown in FIG. 10.

FIG. 15 is a cross sectional view showing the structure of transistors 470 and 530 forming inverter 32' shown in FIG. 14. Each of transistors 470 and 530 is formed in an n+ well region 480 and a p+ well region 540 each formed in an n type substrate. PMOS transistor 470 includes a p+ drain diffusion layer 490, a p+ source diffusion layer 500, and an n++ diffusion layer 51 formed in n+ well region 480, and a gate electrode 520 formed on substrate 40 through an insulating layer (not shown). NMOS transistor 530 includes an n+ drain diffusion layer 550, an n+ source diffusion layer 560, and a p+ diffusion layer formed in a p+ well region 540, and a gate electrode 580.

As NMOS transistor 530 is formed in p+ well region 540, a change in the voltage applied to n+ drain diffusion layer 550 is not easily transmitted as noise $N_s$ through substrate 40. A PMOS transistor 470 is, however, formed in n+ well region 480 having the same conductivity type as that of substrate 40, a change in the voltage applied to p+ drain diffusion layer 490 is liable to be transmitted to analogue circuit 65 as noise $N_s$ through substrate 40. As shown in FIG. 12, NMOS transistor 47 in analogue circuit 65 is therefore subject to adverse effects due to the transmitted noise $N_s$. It is pointed out that PMOS transistor in digital circuit 66 formed within n type substrate 40 is liable to generate the noise $N_s$ which can be easily transmitted through substrate 40.

SUMMARY OF THE INVENTION

One object of this invention is to prevent the analogue signal processing circuit from being influenced by noise generated from a digital signal processing circuit in a semiconductor integrated circuit device with an analogue signal processing circuit and a digital signal processing circuit.

Another object of the invention is to prevent transmission of noise generated from a digital signal processing circuit to an analogue signal processing circuit in a semiconductor integrated circuit device with an analogue signal processing circuit and a digital signal processing circuit.

A further object of the invention is to perform voltage comparing operation correctly in a semiconductor integrated circuit device with a voltage comparator and a digital signal processing circuit formed on a single semiconductor substrate, Still another object of the invention is to perform differential amplification correctly in a semiconductor integrated circuit device with a differential amplifier and a digital signal processing circuit formed on a single semiconductor substrate.

Briefly stated, a semiconductor integrated circuit device in accordance with the present invention comprises an analogue signal processing circuit and a digital signal processing circuit formed on a single semiconductor substrate. The analogue signal processing circuit includes devices coupled only through an impurity region of a conductivity type opposite to that of the substrate.

In operation, as the devices which constitute the analogue signal processing circuit are formed only through the impurity region having the conductivity type opposite to that of the substrate, noise generated from the digital signal processing circuit is not easily transmitted to the devices which form the analogue signal processing circuit.

The semiconductor integrated circuit device in accordance with the present invention, in another aspect, includes an analogue signal processing circuit and a digital signal processing circuit formed on a single semiconductor substrate of a first conductivity type. The digital signal processing circuit includes devices coupled only through an impurity region of a second conductivity type opposite to the first conductivity type formed adjacent to the main surface of the substrate.

In operation, the devices forming the digital signal processing circuit are coupled only through the impurity region having the conductivity type opposite to that of the substrate, and therefore noise generated from the devices is not easily transmitted through the substrate. The analogue signal processing circuit is therefore prevented from being affected by the noise generated from the digital signal processing circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 2:
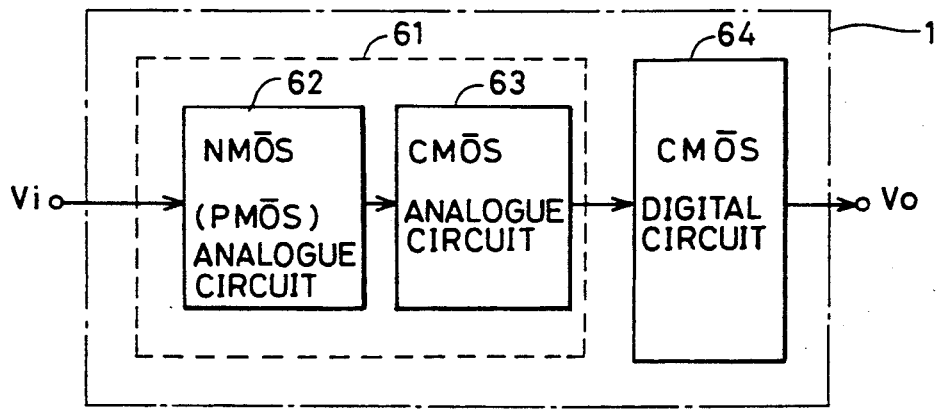
FIG. 2 is a block diagram of an LSI showing one example of a concept of the present invention.

FIG. 2 is a block diagram showing one example of a concept in accordance with a present invention. With reference to FIG. 2, an LSI 1 comprises an analogue circuit 61 for processing an analogue signal and a CMOS digital circuit 64 for processing a digital signal. Analogue circuit 61 comprises an analogue circuit 62 formed exclusively of NMOS transistors (PMOS transistors in some cases) and a CMOS analogue circuit 63 formed of CMOS transistors. Digital circuit 64 is formed of CMOS transistors. It is pointed out that LSI 1 shown in FIG. 2 includes, for example, a circuit for processing voltage signals such as comparison of voltage signals etc. provided in NMOS analogue circuit 62. Also, as the case may be, it is preferred to form the same in a PMOS analogue circuit. Thus, in accordance with the present invention, a circuit for processing a particular analogue signal is formed of transistors of one predetermined conductivity type (NMOS transistors in the example shown in FIG. 2). This will be described more specifically in conjunction with the later description of embodiments.

Figure 1:
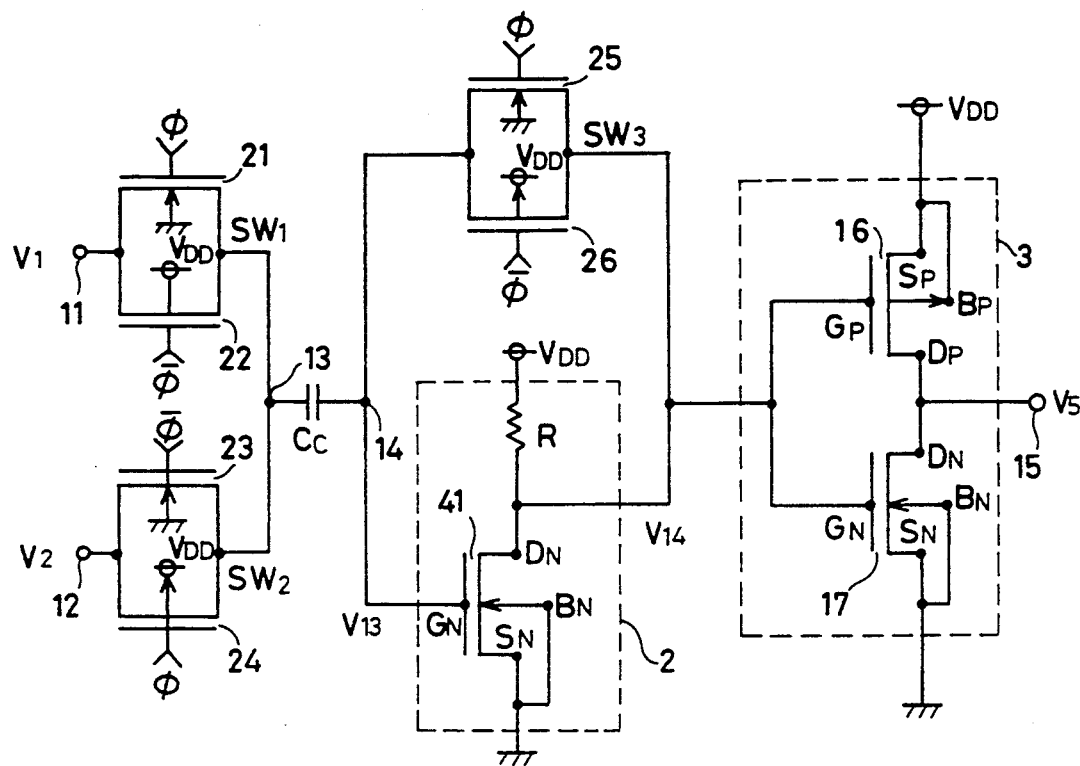
FIG. 1 is a circuit diagram of a voltage comparator showing one embodiment in accordance with the present invention.
Figure 9:
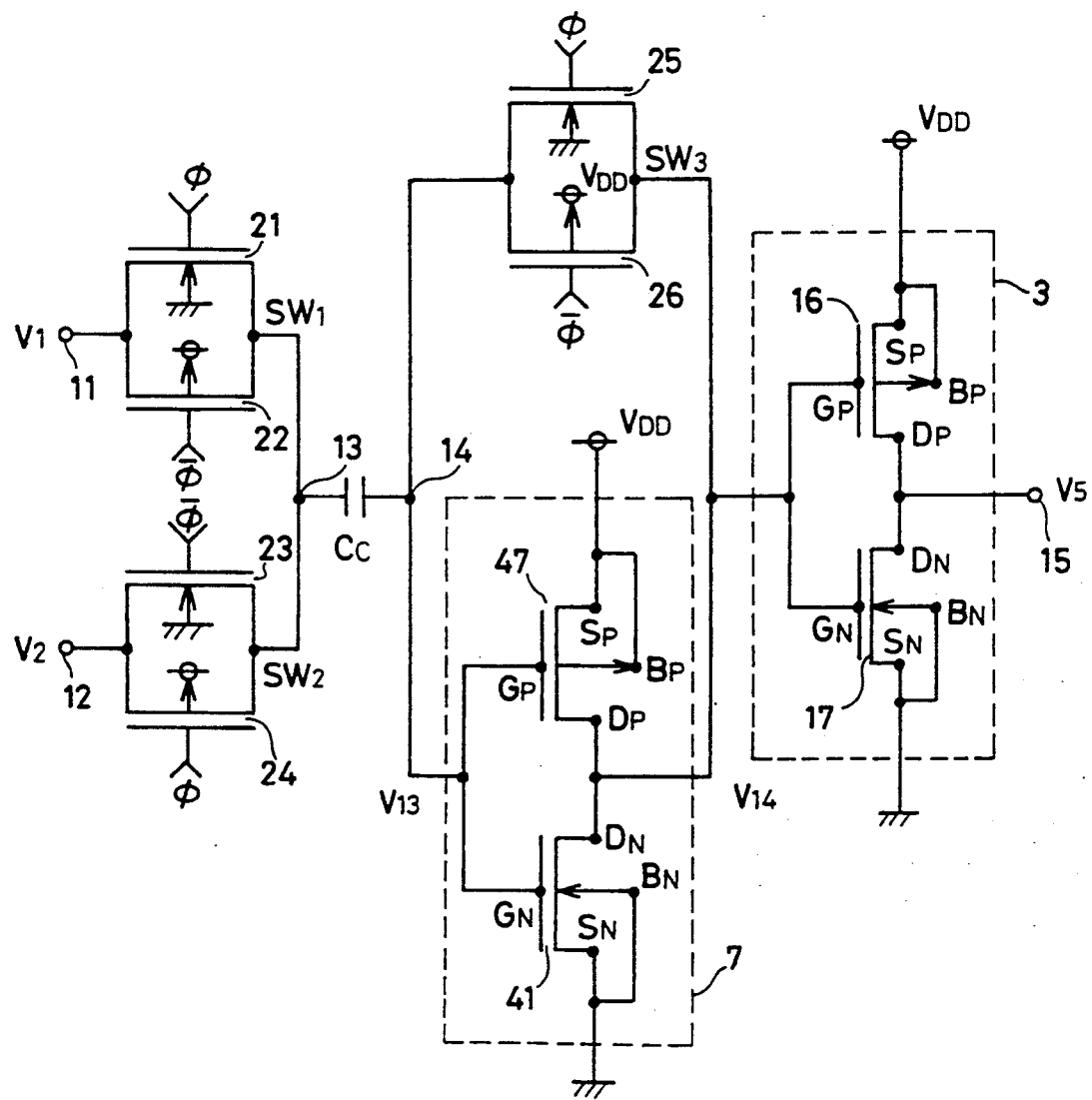
FIG. 9 is a circuit diagram of a conventional voltage comparator.
Figure 10:
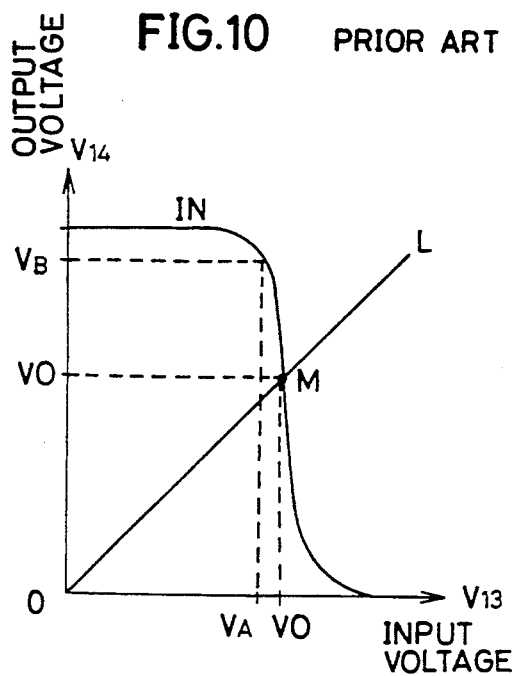
FIG. 10 is a characteristic diagram showing the input-output characteristic of inverter 7 shown in FIG. 9.

FIG. 1 shows one embodiment of a voltage comparator in accordance with the present invention. With reference to FIG. 1, compared to a conventional voltage comparator, FIG. 1 embodiment differs in that an inverter 2 is provided in place of inverter 7 indicated in FIG. 9. That is, inverter 2 comprises a resistance R and an NMOS transistor 41 connected in series between a voltage supply $V_{DD}$ and ground. Inverter 2 is provided as an example of NMOS analogue circuit 62 indicated in FIG. 2. Description will not be given on the structures of the other circuits shown in the FIG. 1, since they are the same as those shown in FIG. 9, but they are provided as CMOS analogue circuit 63 shown in FIG. 2. The operation of the voltage comparator shown in FIG. 1 will not be described here because it is the same as the conventional one in FIG. 9.

Figure 3:
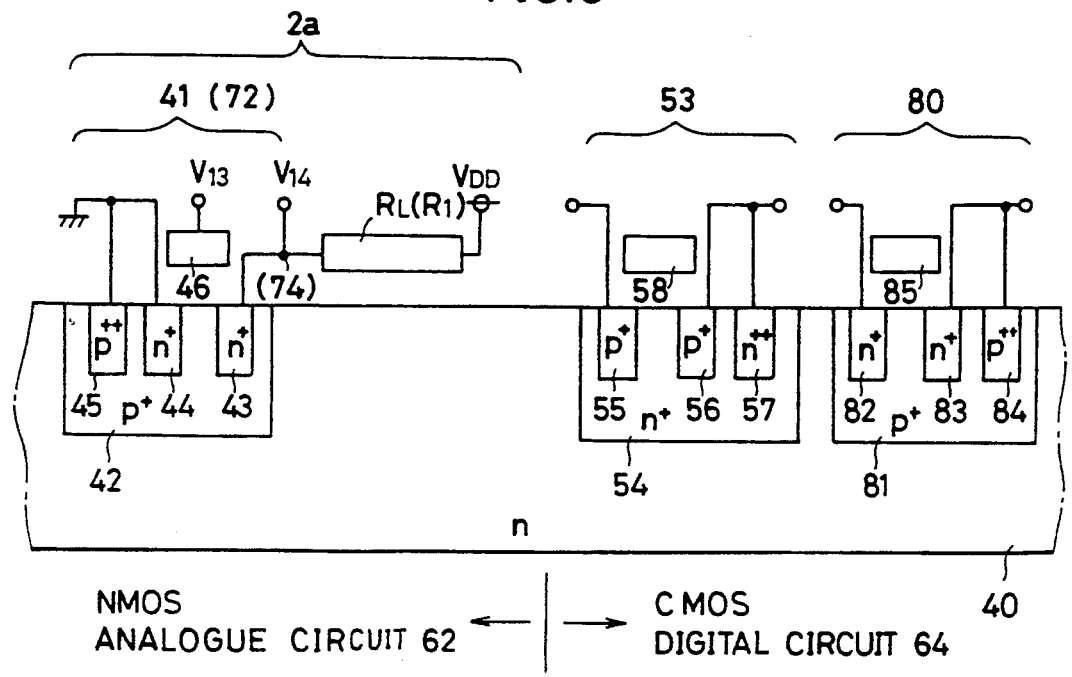
FIG. 3 is a diagram schematically showing a cross-section of the structure of inverter 2 shown in FIG. 1.
Figure 4:
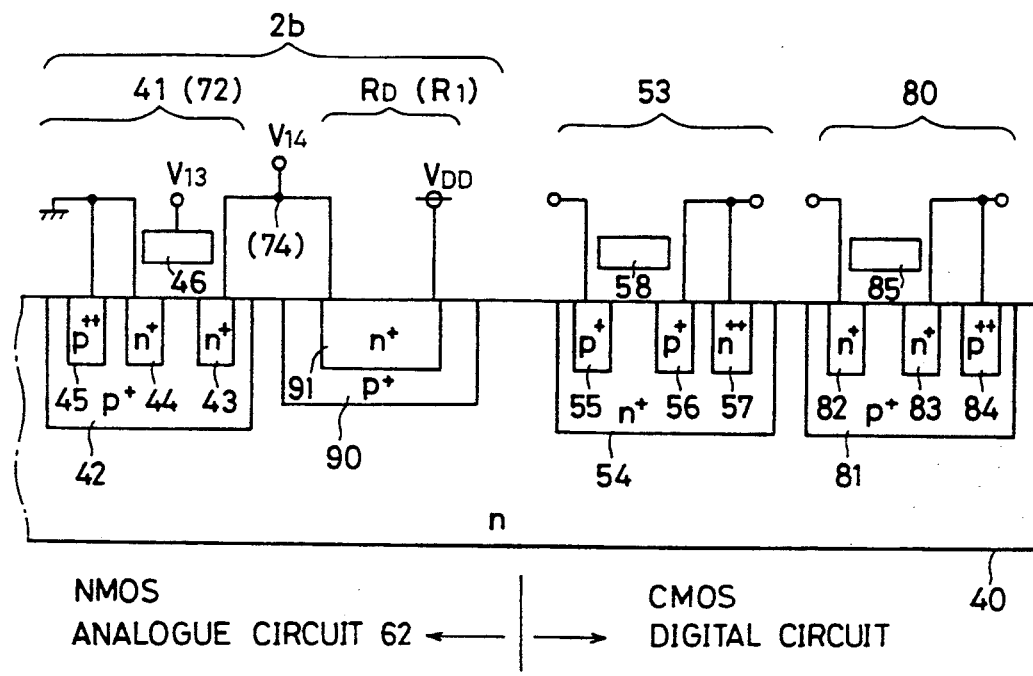
FIG. 4 is diagram a schematically showing another cross-section of the structure of inverter 2 shown in FIG. 1.
Figure 13:
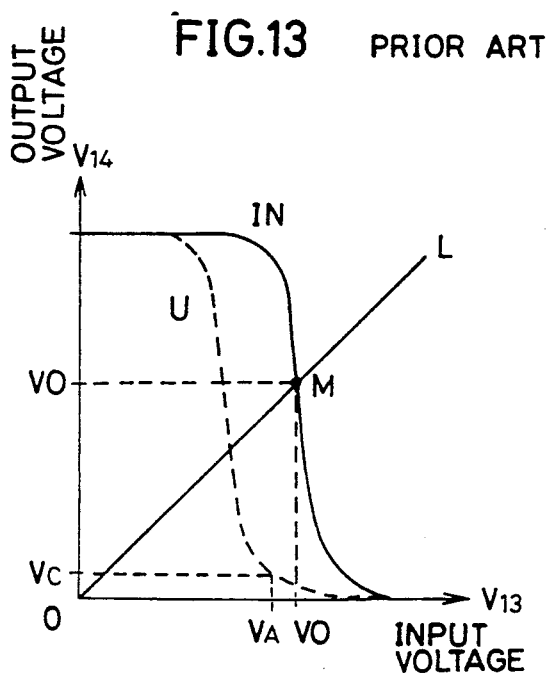
FIG. 13 is a characteristic diagram showing the input-output characteristic of an inverter influenced b noise.
Figure 14:
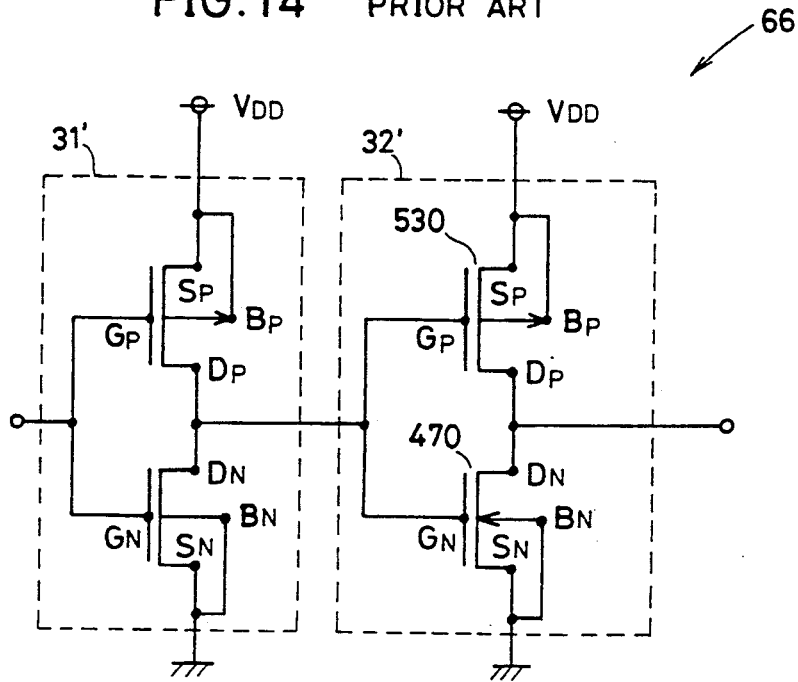
FIG. 14 is a circuit diagram of a buffer circuit in a conventional CMOS digital circuit.
Figure 11:
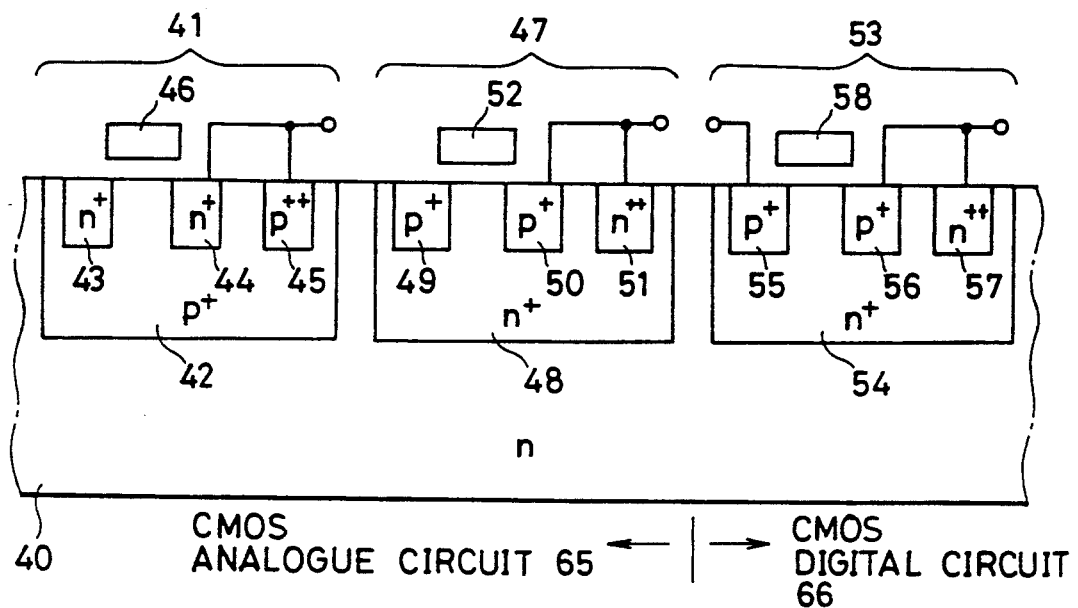
FIG. 11 is a diagram schematically showing a cross-section of the structure of inverter 7 shown in FIG. 9.
Figure 12:
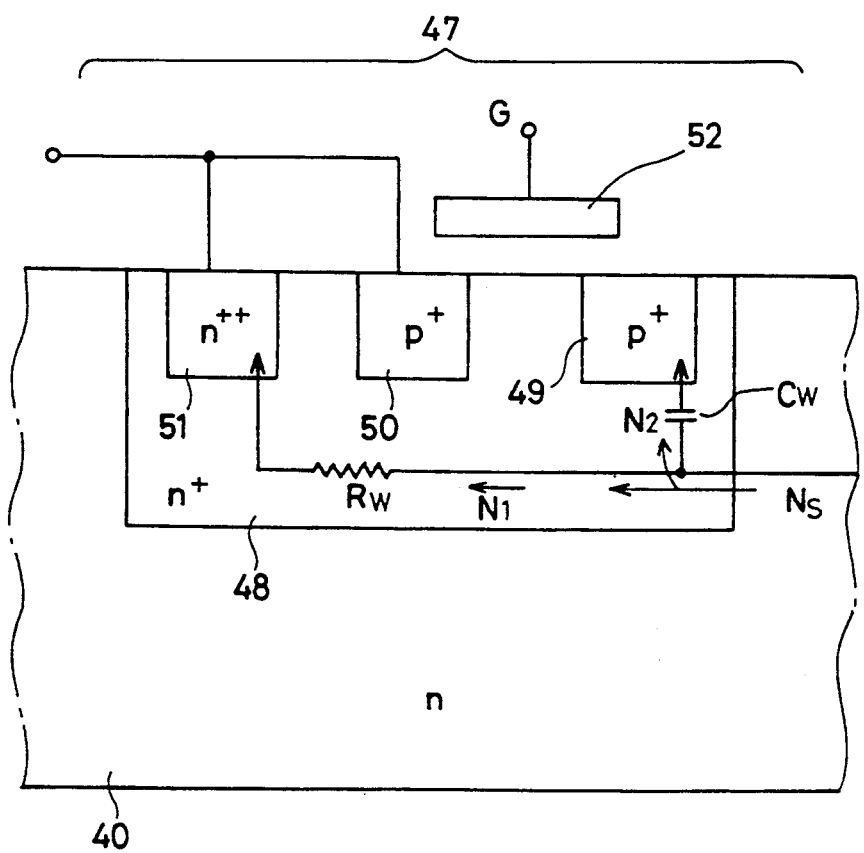
FIG. 12 is a schematic cross-section to describe the influence of noise in transistor 47 shown in FIG. 11.
Figure 15:
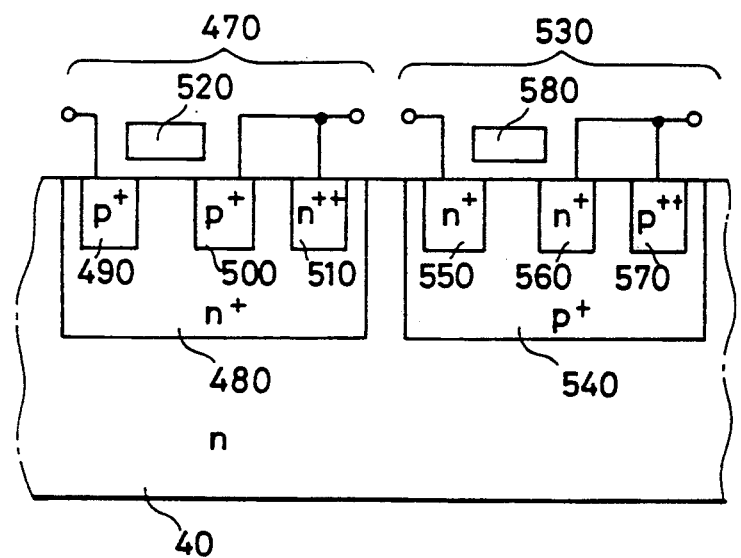
FIG. 15 is a diagram schematically showing a cross-section of the succeeding stage inverter shown in FIG. 14.

FIG. 3 shows a cross-section of the structure of an example 2a of inverter 2 shown in FIG. 1. Inverter 2a is provided as NMOS analogue circuit 62. A PMOS transistor 53 and an NMOS transistor 80 are provided in place of CMOS digital circuit 64. Inverter 2a comprises NMOS transistor 41 and a wiring resistance $R_L$ formed of polysilicon. Transistor 41 has the same structure in section as the one shown in FIG. 11. Applying inverter 2a having the structure in section shown in FIG. 3 in place of inverter shown in FIG. 1 permits inverter 2a to be free from the effect caused by noise. Because transistor 41 is provided in well region 42 with the conductivity type (p) opposite to the conductivity type (n) of substrate 40, noise transmitted through substrate 40 is not delivered into well region 42. In addition, since the wiring resistance $R_L$ provided apart from substrate 40 is employed as the load resistance of inverter 2a, the wiring resistance $R_L$ is also free from the effect of the noise. Since the wiring resistance $R_L$ is free from the effect of the noise, the input-output characteristic of inverter 2a is not changed by the effect of the noise. Consequently, for the input-output characteristic of inverter 2a is stabilized, and the change in the input-output characteristic as shown in FIG. 13 does not take place. This means that the voltage comparator shown in FIG. 1 operates normally independent of the effect of the noise generated from CMOS digital circuit 64. Another example of structure of inverter 2 in FIG. 1 is shown in section in FIG. 4. In FIG. 4, a diffusion resistance $R_D$ is used in place of the wiring resistance $R_L$ shown in FIG. 3. That is, an inverter 2b is employed as inverter 2 shown in FIG. 1. Inverter 2b comprises NMOS transistor 41 and the diffusion resistance $R_D$. The diffusion resistance $R_L$ comprises a p+ well region 90 formed in a substrate 40 and an N+ well region 91 formed in the well region 90. The well regions 90 and 91 form the diffusion resistance $R_D$. As can be seen from FIG. 4, the diffusion resistance $R_D$ is formed in well region 90 of the conductivity type (p) opposite to the conductivity type of substrate 40 (n), and it is pointed out that this inverter 2b is therefore free from the effect of noise and has a stable input-output characteristic. Accordingly, the voltage comparator having inverter 2b with the structure in section shown FIG. 4 can normally operate independent of the effect of the noise from CMOS digital circuit 64.

Figure 5:
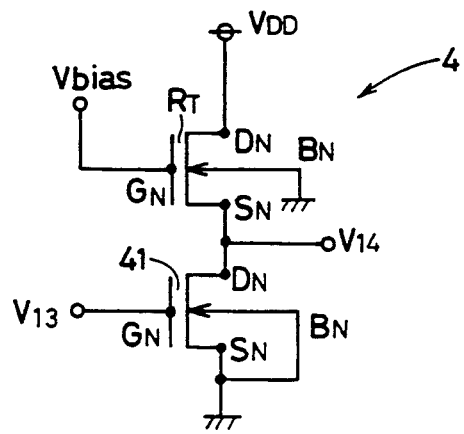
FIG. 5 is a circuit diagram showing an inverter applicable in place of inverter 2 shown in FIG. 1.

FIG. 5 shows a circuit diagram of an inverter 4 applicable in place of inverter 2 shown in FIG. 1. Inverter 4 comprises two NMOS transistors $R_T$ and 41 connected in series between the voltage supply $V_{DD}$ and ground. Transistor $R_T$ has its gate connected to receive a bias voltage Vbias. Transistor $R_T$ therefore operates as a resistance device having a resistance value determined by the voltage Vbias. Transistor 41 has its gate connected to receive an input voltage V13.

Figure 6:
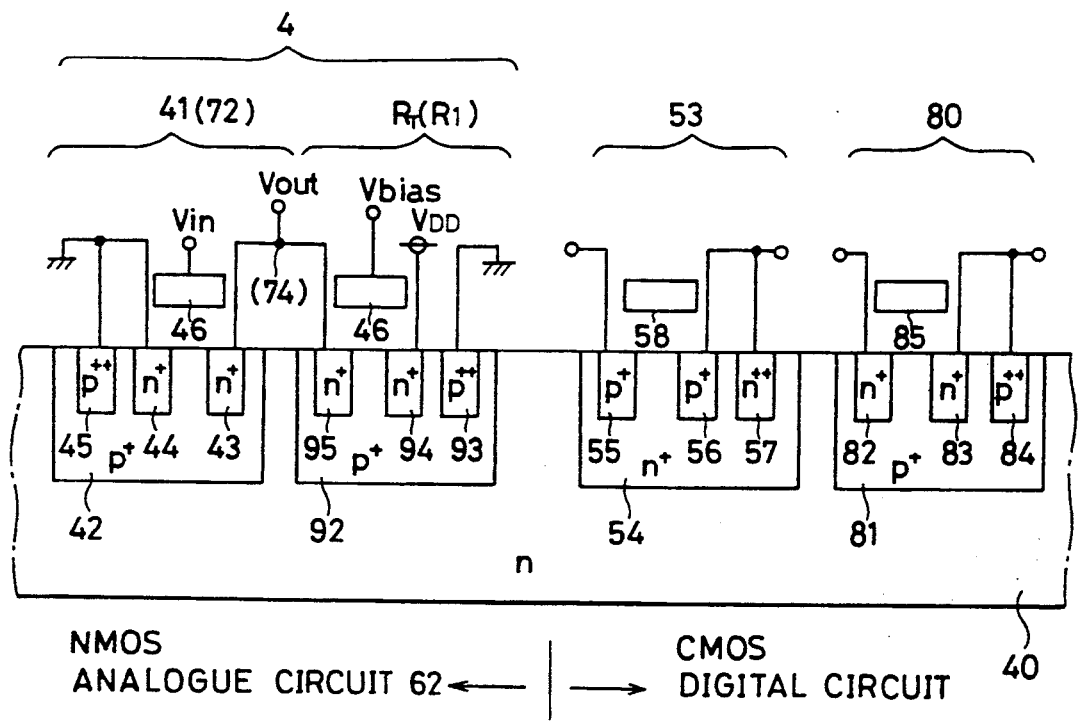
FIG. 6 is a diagram schematically showing a cross-section of the structure of the inverter shown in FIG. 5.

FIG. 6 shows an example of structure of inverter 4 shown in FIG. 5 in section. Transistor $R_T$ has the same structure as that of transistor 41 in section. Transistor $R_T$ is therefore provided in well region 92 having the opposite conductivity type to that of substrate 40, transistor $R_T$, i.e. the resistance device is free from the effect of noise. By employing inverter 4 shown in FIG. 5 in place of inverter 2 of the voltage comparator shown in FIG. 1, a voltage comparator independent of the effect of the noise generated from CMOS digital circuit 64 can be obtained.

Figure 7A:
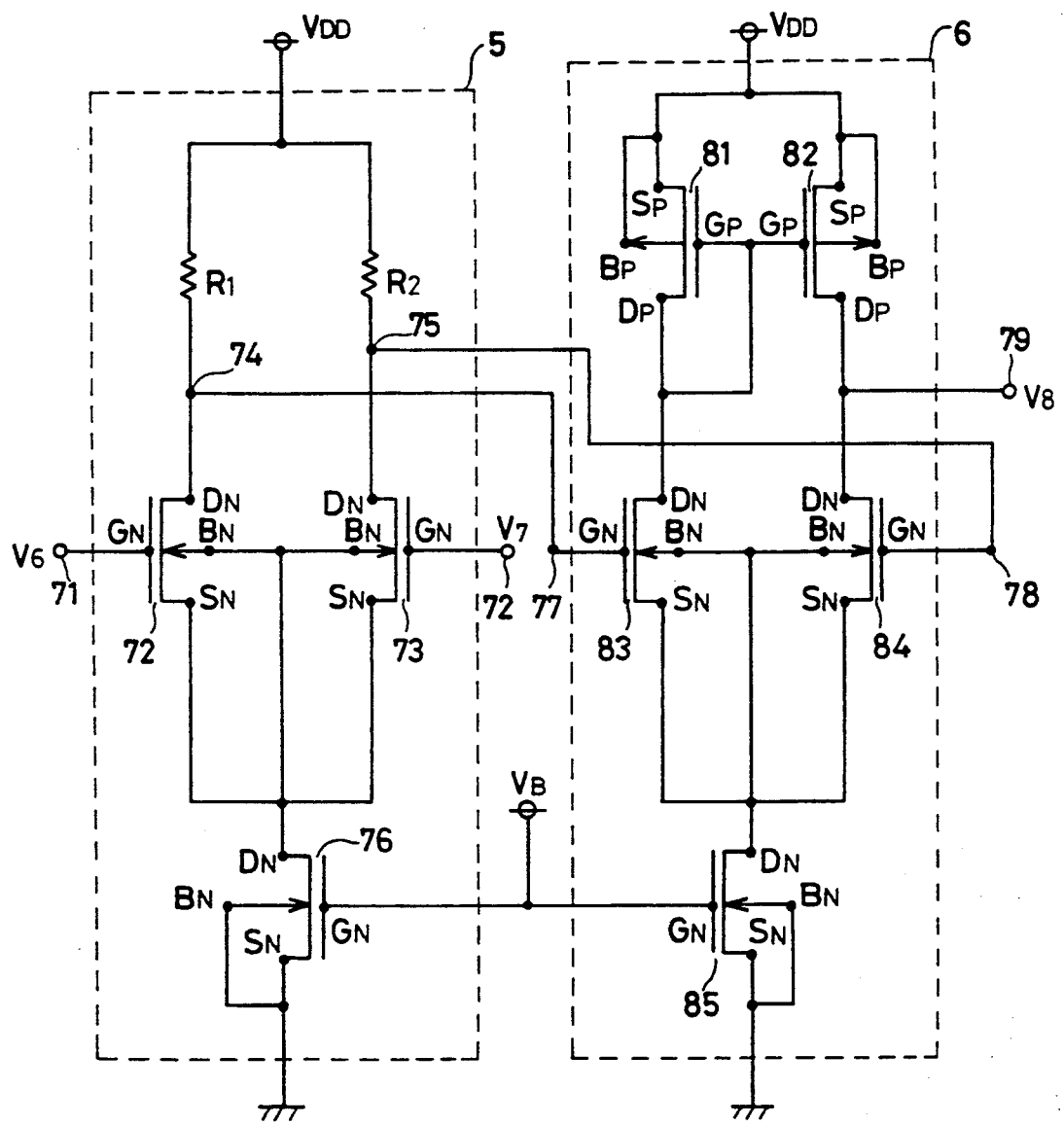
FIG. 7A is a circuit diagram of a differential amplifier circuit showing another embodiment in accordance with the present invention.

FIG. 7A shows a differential amplifier circuit representing another embodiment in accordance with the present invention. With reference to FIG. 7A, the differential amplifier circuit comprises first and second differential amplifiers 5 and 6. For the first differential amplifier 5 is liable to be affected by noise transmitted through the substrate, it comprises devices of one conductivity type, i.e. NMOS transistors 72, 73 and 76, and resistance R1 and R2. Transistor 76 has its gate connected to receive a bias voltage $V_B$. Transistor 76 thus forms a constant current source. Transistors 72 and 73 have their gates connected to receive input voltages V6 and V7, respectively. Transistor 72 has its drain electrode $D_N$ connected to a power supply $V_{DD}$ through the resistance R1. Transistor 73 has its drain electrode connected to the power supply $V_{DD}$ through the resistance R2. A common connection node 74 of transistor 72 and resistance R1 forms one output of the first differential amplifier 5, while a common connection node 75 of transistor 73 and resistance R2 forms the other output. Transistors 72 and 73 are connected together to the drain electrode $D_N$ of transistor 76 whose source electrode $S_n$ and backgate terminal form a constant current source. Transistor 76 has its source electrode $S_N$ and backgate terminal $B_N$ grounded.

The second differential amplifier 6 comprises PMOS transistors 81 and 82, and NMOS transistors 83, 84 and 85. Transistors 81 and 82 have the respective source electrodes $S_P$ and backgate terminals $B_P$ connected to a power supply $V_{DD}$. The gate electrodes $G_P$ of transistors 81 and 82 are connected together to the drain electrode $D_P$ of transistor 81. The drain electrode $D_P$ of transistor 81 is connected to the drain electrode $D_N$ of transistor 83. The drain electrode $D_P$ of transistor 82 is connected to the drain electrode $D_N$ of transistor 84. Transistors 83 and 84 have their respective gate electrodes $S_N$ and backgate terminals $B_N$ connected to receive output voltages from the first differential amplifier 5, respectively. Transistors 83 and 84 have their respective source electrodes $S_N$ and backgate terminals $B_N$ connected together to the drain electrode $D_N$ of transistor 85 which forms a constant current source. The gate electrode of transistor 85 is connected to receive a bias voltage $V_B$. Transistor 85 has its source electrode $S_N$ and backgate terminal $B_N$ grounded. A common connection node of transistors 82 and 84 is connected to the output terminal of 79 to output an output voltage V8 through the terminal 79.

Also in the embodiment, it is pointed out that the first differential amplifier 5 which is liable to be affected by noise from CMOS digital circuit, is formed of NMOS transistors 72, 73 and 76, and resistance devices R1 and R2, as is the case with inverter 2 shown in FIG. 1, and therefore, this first differential amplifier 5 is hard to be adversely affected by noise. NMOS transistors 72, 73 and 76 as well as resistance R1 and R2 provided in the first differential amplifier 5, have the same structures in section as transistor 41, resistance $R_L$ and $R_D$ shown in FIG. 3 or FIG. 4. In addition, in place of resistance R1 and R2, NMOS transistor $R_T$ with the structure in section shown in FIG. 6 may be used.

In an example shown in FIG. 7A, though the second differential amplifier 6 is formed as a CMOS circuit, a circuit identical with the first differential amplifier 5 may be employed as the second differential amplifier.

It is pointed out that in the above mentioned embodiment, though NMOS analogue circuit 62 is formed on an n type semiconductor substrate 40, the same effect can be obtained, by forming a PMOS analogue circuit on a p type semiconductor substrate instead. In this case, the conductivity types of transistors constituting each circuit are inverted respectively.

Furthermore, in the above mentioned embodiment, the circuit configuration representing an approach on the side affected by noise, i.e. in an analogue circuit, has been described, but it is also effective to take a similar approach on the side generating noise, i.e. in CMOS digital circuit 64 shown in FIG. 2. That is, as CMOS digital circuit 64 is provided with a buffer circuit which can drive a large parasitic capacitance, the buffer circuit could often be the source of noise. As for the buffer circuit, it is possible to reduce generation of noise by application of an inverter having the structure in section as shown in FIG. 3, FIG. 4 and FIG. 6. This point will be described in detail in the following.

Figure 7B:
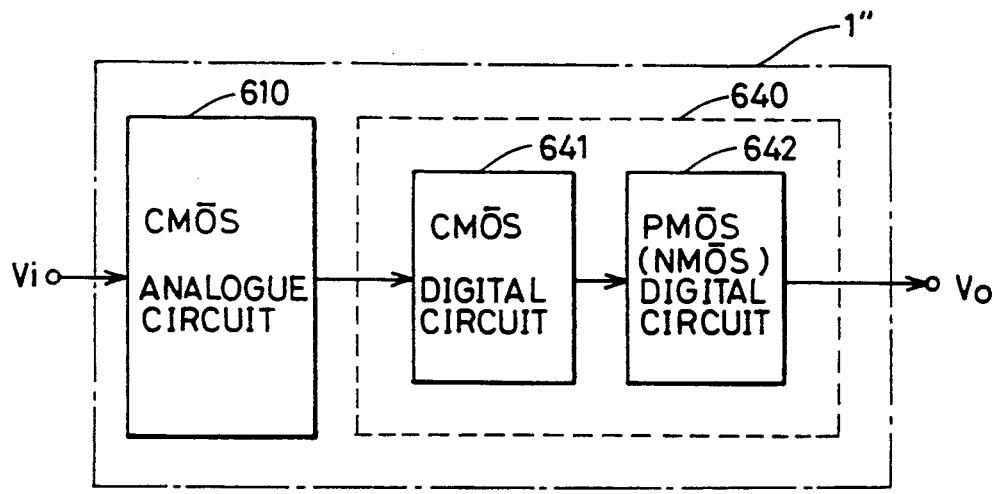
FIG. 7B is a block diagram of an LSI representing another concept of the present invention.

Referring to FIG. 7B, LSI 1" includes a CMOS analogue circuit 610 and a CMOS digital circuit 640. Digital circuit 640 includes a digital circuit 641 formed by CMOS transistors, and a digital circuit 642 formed exclusively by PMOS transistors (or NMOS transistors). Generally, a circuit forming the output stage of a digital circuit should drive a large load connected to the output, and, therefore, noise is liable to be generated at the time of the switching operation. Consequently, in another embodiment of the present invention shown in FIG. 7B, the circuit 642 forming the output stage of digital circuit 640 is formed exclusively by PMOS transistors (or NMOS transistors). In case the conductivity type of the semiconductor substrate is n type, circuit 642 is formed exclusively by PMOS transistors, and on the other hand, if the conductivity type of the semiconductor substrate is p type, circuit 642 is formed exclusively by NMOS transistors. Noise which might be generated in digital circuit 642 is not therefore easily transmitted to the substrate, and analogue circuit 610 is prevented from being influenced by the noise.

Figure 7C:
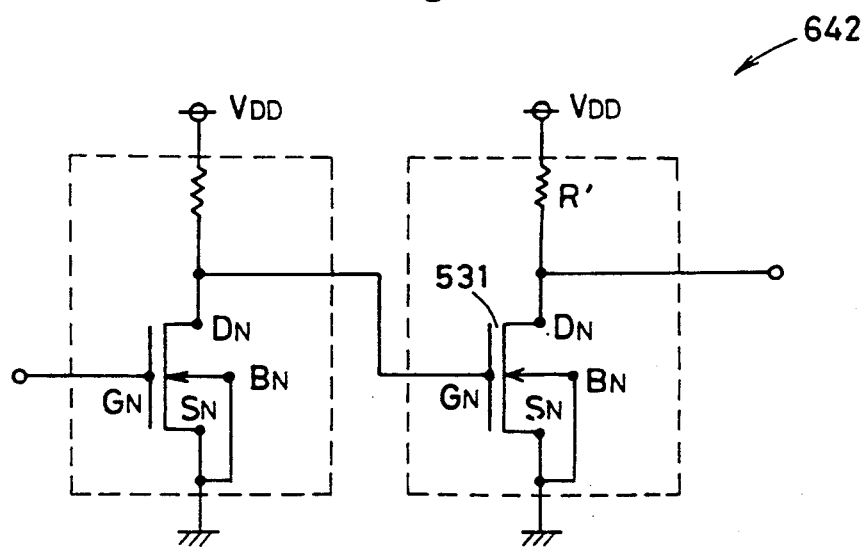
FIG. 7C is a circuit diagram of a buffer circuit representing another embodiment in accordance with the present invention.

One example of digital circuit 642 is a buffer circuit 642 shown in FIG. 7C. Buffer circuit 642 is formed exclusively by NMOS transistors. In other words, no PMOS transistor is used thereon. Buffer circuit 642 includes two cascaded inverters. The inverter in the succeeding stage includes a resistance device R' connected in series between a power supply $V_{DD}$ and ground, and an NMOS transistor 531. The structure of the inverter in the succeeding stage is shown in section in FIG. 7D.

Figure 7D:
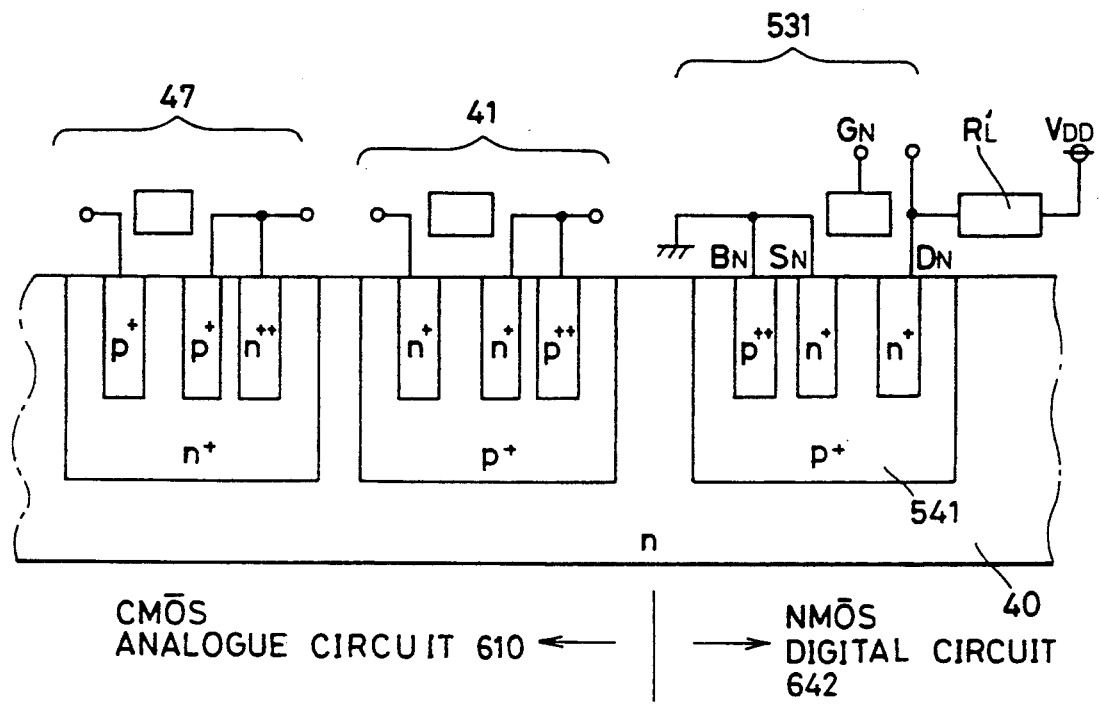
FIG. 7D is a diagram schematically showing a cross-section of the structure of the inverter shown in FIG. 7C.

As shown in FIG. 7D, NMOS transistor 531 forming the inverter in the succeeding stage is formed within P+ well region 541. Additionally, resistance device RL' is formed on an insulating layer (not shown) formed on the substrate. Changes in voltage applied to the n+ drain diffusion layer of transistor 531 is hardly transmitted to n type substrate 40.

Figure 7E:
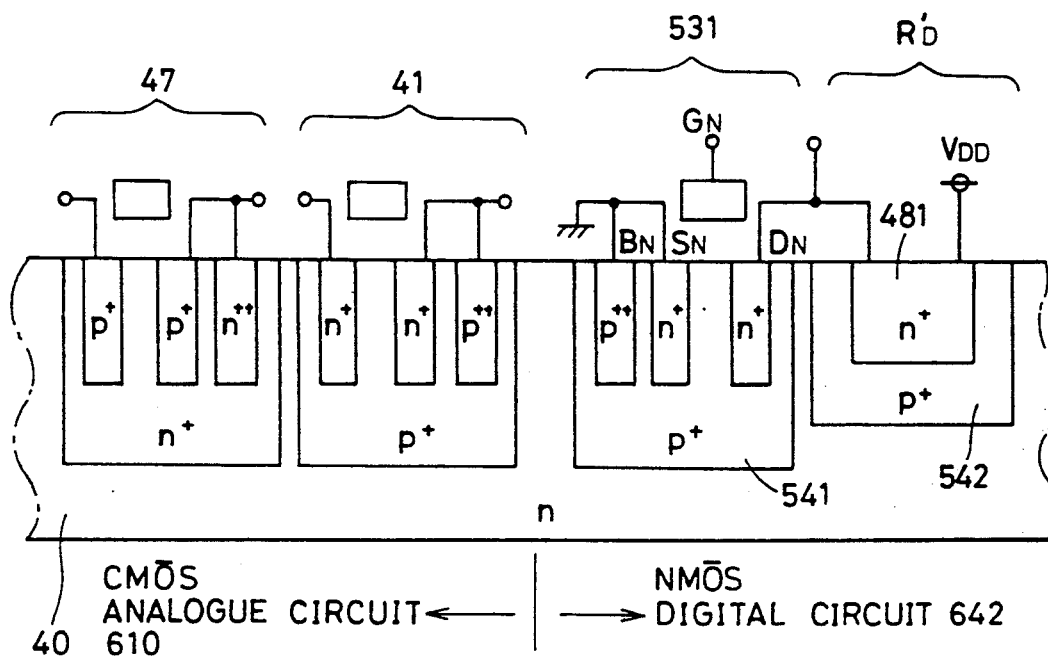
FIG. 7E is a diagram schematically showing another cross-section of the structure of the inverter shown in FIG. 7C.
Figure 8:
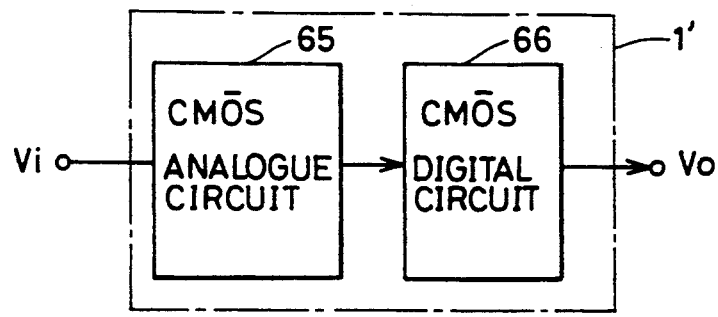
FIG. 8 is a block diagram showing a concept of a conventional LSI.

Referring to FIG. 7E, a resistance device $R_D$, forming an inverter in the succeeding stage is formed within n+ diffusion layer 481. An n+ diffusion layer 481 is formed within p+ well region 542 formed in n type substrate 40, changes in voltage applied to n+ diffusion layer 481 are prevented from being transmitted to the substrate.

The formation of the circuit 642 in the succeeding stage forms digital circuit 640 as shown in FIGS. 7D and 7E allows the prevention of the noise which might be generated in the digital circuit 642 being transmitted to the substrate. It is pointed out that analogue circuit 610 is not easily influenced by the noise, accordingly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device including an analogue signal processing circuit and a digital signal processing circuit formed on a single semiconductor substrate of a first conductivity type,
said analogue signal processing circuit comprising device coupled only through an impurity region formed adjacent to the main surface of said substrate and of a second conductivity type opposite to the first conductivity type.

2. The semiconductor integrated circuit device in accordance with claim 1, wherein said device coupled only through said impurity region comprise at least one of an active device and a first passive device formed in said impurity region.

3. The semiconductor integrated circuit device in accordance with claim 2, wherein said devices coupled only through said impurity region further comprise a second passive device connected to at least one of said active device and first passive device and formed on said semiconductor substrate.

4. The semiconductor integrated circuit device in accordance with claim 2, wherein
said active device comprises a field effect transistor, and
said first passive device comprises a resistance device.

5. A semiconductor integrated circuit device including an analogue signal processing circuit and a digital signal processing circuit formed on a single semiconductor substrate of a first conductivity type, wherein
said digital signal processing circuit comprises devices coupled only through an impurity region of a second conductivity type opposite to said first conductivity type formed adjacent tot he main surface of said substrate.

6. The semiconductor integrated circuit device in accordance with claim 5, wherein said devices coupled only through said impurity region comprise at least one of an active device and a first passive device formed in said impurity region.

7. The semiconductor integrated circuit device in accordance with claim 6, wherein said devices coupled only through said impurity region further comprise a second passive device connected to at least one of said active device and first passive device and formed on said semiconductor substrate.

8. The semiconductor integrated circuit device in accordance with claim 6, wherein said active device comprises a field effect transistor, and said first passive device comprises a resistance device.

9. A semiconductor integrated circuit device including a voltage comparator and a digital signal processing circuit formed on a single semiconductor substrate of a first conductivity type, said digital signal processing circuit having a tendency to transmit noise to said voltage comparator through said substrate, said voltage comparator comprising, capacitance means having a first electrode and a second electrode, means for applying at a first timing a first voltage signal to be compared to the first electrode of said capacitance means, means for applying at a second timing following said first timing a second voltage signal to be compared to the first electrode of said capacitance means, inverter means connected to the second electrode of said capacitance means, and switching means connected between an input and an output of said inverter means for switching on at said first timing, said inverter means including a field effect device of the first conductivity type and resistance means formed in an impurity region of a second conductivity type opposite to the first conductivity type formed adjacent to the main surface of said substrate, said field effect device having a control electrode to receive outputs from said first and second voltage signal applying means.

10. A semiconductor integrated circuit device comprising:

a semiconductor substrate of a first conductivity type, a differential amplifier formed on said semiconductor substrate, and a digital signal processing circuit formed on said semiconductor substrate, an impurity region of a second conductivity type opposite to the first conductivity type formed in said substrate, said digital signal processing circuit having a tendency to transmit noise to said differential amplifier through said substrate, said differential amplifier comprising, a first series connection of a first resistance means and a field effect transistor of the first conductivity type, a second series connection of a second resistance means and a second field effect transistor of the first conductivity type, said first and second series connections being connected in parallel to each other to constitute a parallel connection, and a third field effect transistor of the first conductivity type for forming a constant current source, said parallel connection and third field effect transistor being connected in series between a first power supply potential and a second power supply potential, said first, second and third field effect transistors being formed on said impurity region, said first and second resistor means being formed through said impurity region.

11. A semiconductor integrated circuit device including an analogue signal processing circuit and a digital signal processing circuit formed on a single semiconductor substrate of a first conductivity type, wherein said digital signal processing circuit comprises an output buffer provided in its output stage, and said output buffer comprises a field effect device of the first conductivity type and resistance means formed in an impurity region of a second conductivity type opposite to the first conductivity type.

* * * * *